United States Patent [19]
Higashiyama et al.

[11] Patent Number: 6,166,596
[45] Date of Patent: Dec. 26, 2000

[54] HIGH EFFICIENCY POWER AMPLIFYING APPARATUS WITH PHASE COMPENSATION CIRCUIT

[75] Inventors: Katsuhiko Higashiyama, Osaka-fu; Tsuyoshi Sato, Kyoto-fu, both of Japan

[73] Assignee: Matsushita Electric Industrial Co., Ltd., Osaku-fu, Japan

[21] Appl. No.: 09/282,144

[22] Filed: Mar. 31, 1999

[30] Foreign Application Priority Data

Mar. 31, 1998 [JP] Japan ................................. 10-085814

[51] Int. Cl.[7] ........................................................ H03F 3/38
[52] U.S. Cl. ............................................. 330/10; 330/251
[58] Field of Search ................................. 330/10, 207 A, 330/251, 136

[56] References Cited

U.S. PATENT DOCUMENTS 5,973,556  10/1999  Su .............................................. 330/10

*Primary Examiner*—Robert Pascal
*Assistant Examiner*—Henry Choe
*Attorney, Agent, or Firm*—Greenblum & Bernstein, P.L.C.

[57] ABSTRACT

A synchronously driven linear power amplifier (6) parallel to class D power amplifier (2) achieves an active filter equivalent, minimizing the scale of the passive filter (3), and effectively suppressing high frequency noise. Signal delay introduced by the passive filter (3) is also compensated by means of a phase compensation circuit (7) for phase compensating an audio signal applied from a signal input terminal (21).

26 Claims, 17 Drawing Sheets

6,166,596

HIGH EFFICIENCY POWER AMPLIFYING APPARATUS WITH PHASE COMPENSATION CIRCUIT

BACKGROUND OF THE INVENTION

1. Field of the Invention

The present invention relates to a high efficiency power amplifying apparatus having a class D power amplifier, and more particularly relates to a low noise, high efficiency power amplifying apparatus suitable for audio signal amplification.

2. Description of the Related Art

High efficiency power amplifiers according to the related art that are used to drive loudspeakers typically use some type of class D power amplifier for power amplification because of their high power efficiency and suitability for audio signal amplification. A high efficiency power amplifying apparatus using this type of class D power amplifier is therefore described below with reference to the accompanying FIG. 19.

Shown in FIG. 19 are: a signal input terminal 301, class D power amplifier 302, speaker input terminal 303, class D power amplifier output terminal 304, positive supply terminal 305 and negative supply terminal 306 for the class D power amplifier 302, passive low-pass filter 307, and speaker 326. The passive low-pass filter 307 further comprises coils 310A, 310B, and 310C, and capacitors 311A, 311B, and 311C.

A high efficiency power amplifying apparatus thus comprised according to the related art operates as described below.

An audio signal input to the signal input terminal 301 is first power amplified by the class D power amplifier 302 using pulse width modulation (PWM) with a switching operation. A heavily pulse-width modulated carrier signal is therefore output from the output terminal 304 of the class D power amplifier 302. To remove this modulated carrier signal, the passive low-pass filter 307 operates as a sharp six-stage Butterworth type filter having three coil and capacitor stages.

A typical filter characteristic is shown in FIG. 20. As will be known from FIG. 16, the cut-off frequency (fc) of the filter is normally set somewhere above 20 kHz, that is, above the highest audio signal frequency, so that the audio signal is passed to the speaker without attenuation. If the PWM carrier frequency is 200 kHz, for example, attenuation, which is determined by the characteristics of the low-pass filter, is limited (−60 dB, for example). The PWM carrier frequency component at the speaker input terminal 303 is thus input to the speaker 326 as residual noise.

With a high efficiency power amplifying apparatus according to the related art as described above, a limited amount of residual noise from the PWM carrier frequency component is superimposed on the audio signal no matter how sharp the filter characteristics of the passive low-pass filter 307. This noise component is emitted from the speaker wire as high frequency noise that can adversely affect all kinds of electronics. Expensive coils and capacitors are also needed to build a high order passive low-pass filter, and high costs must therefore be incurred to achieve an anti-noise filter.

With consideration for the above-noted problems, an object of the present invention is therefore to provide a high efficiency power amplifying apparatus which overall is less expensive and achieves less high frequency noise than a high efficiency power amplifying apparatus according to the related art while also minimizing the use of expensive passive filters.

SUMMARY OF THE INVENTION

To achieve the above object, a high efficiency power amplifying apparatus according to a first aspect of the present invention is directed to a high efficiency power amplifying apparatus for power amplifying an input signal applied to a signal input terminal wherein a PWM power amplifier power amplifies an input signal from a signal input terminal by pulse width modulation. A passive low-pass filter demodulates and outputs a pulse width modulated signal output from the PWM power amplifier. A positive floating voltage source shifts a demodulated signal output from the passive low-pass filter a specific voltage +DV to supply a forward current. A negative floating voltage source shifts a demodulated signal output from the passive low-pass filter a specific voltage −DV to supply a reverse current. A phase compensation circuit phase compensates an input signal applied from the signal input terminal according to a signal output from the passive low-pass filter. A linear voltage amplifier having a linear circuit design voltage amplifies a signal phase compensated by the phase compensation circuit, shifts the amplified signal a specific voltage +dV and −dV, and outputs the shifted amplified signals. An output device current amplifies the +dV shifted voltage amplified signal by said forward current to generate a forward current amplified signal, current amplifies the −dV shifted voltage amplified signal by said reverse current to generate a reverse current amplified signal, and applies said forward current amplified signal and reverse current amplified signal in a push-pull fashion to generate a power amplified signal.

In a high efficiency power amplifying apparatus for power amplifying an input signal applied to a signal input terminal according to a second aspect of the present invention, a first bias supply applies a forward bias voltage to an input signal from the signal input terminal. A first PWM power amplifier power amplifies the forward biased input signal by pulse width modulation to generate a first pulse width modulated signal. A first passive low-pass filter demodulates the first pulse width modulated signal to generate and output a first demodulated signal. A second bias supply for applying a reverse bias voltage to an input signal from the signal input terminal. A second PWM power amplifier power amplifies the reverse biased input signal by pulse width modulation to generate a second pulse width modulated signal. A second passive low-pass filter demodulates the second pulse width modulated signal to generate and output a second demodulated signal. A phase compensation circuit phase compensates an input signal applied from the signal input terminal according to a signal output from the passive low-pass filter. A linear voltage amplifier having a linear circuit design voltage amplifies a signal phase compensated by the phase compensation circuit, shifts the amplified signal a specific voltage +dV and −dV, and outputs the shifted amplified signals. An output device current amplifies a +dV shifted voltage amplified signal by the first demodulated signal to generate a forward current amplified signal, current amplifies a −dV shifted voltage amplified signal by the second demodulated signal to generate a reverse current amplified signal, and applies the forward current amplified signal and reverse current amplified signal in a push-pull fashion to generate a power amplified signal.

In a high efficiency power amplifying apparatus according to either of the above-preferred versions of the present invention, the output device is preferably a push-pull circuit comprising a complementary-symmetry circuit.

Yet further preferably, the linear voltage amplifier and output device function as a class B power amplifier, a class AB power amplifier, or a class A power amplifier.

Yet further preferably, the passive low-pass filter comprises a spiral shaped electrode formed on a substrate. In this case, the spiral shaped electrode is also preferably a copper foil pattern forming a coil.

In a further preferred version of the invention, the phase compensation circuit of the high efficiency power amplifying apparatus is a passive filter having the same number of poles as the passive low-pass filter. In another preferred version, the phase compensation circuit is an active filter having a same number of poles as said passive low-pass filter.

In yet another version, the phase compensation circuit is within the linear voltage amplifier. In this case, the linear voltage amplifier preferably comprises an operational amplifier for voltage amplifying a signal applied to the signal input terminal; an input circuit for adjusting an input impedance to the operational amplifier; and a feedback circuit to the operational amplifier. The input circuit and feedback circuit each has a capacitor and a specific circuit constant such that a specific phase compensation is applied to a signal from the signal input terminal. Further preferably, the input circuit and feedback circuit are comprised to have the same number of poles as the passive low-pass filter.

The PWM power amplifier connected to the signal input terminal is a class D power amplifier, and the linear voltage amplifier connected to the signal input terminal and the output device form a linear power amplifier. The output device is a complementary-symmetry output device operating as an active filter equivalent.

The power efficiency of a high efficiency power amplifying apparatus thus comprised according to the present invention is the sum of the power loss of the class D power amplifier and linear power amplifier. If the voltage of the positive floating voltage source and negative floating voltage source driving the complementary-symmetry output device of the linear power amplifier can be set to the lowest possible voltage, the power loss of the linear power amplifier can be minimized, and the normal high efficiency of a class D power amplifier is not lost. The scale of the passive filter can also be minimized using a pair of coils, capacitors, and resistors, the limits of passive filter characteristics can be overcome by using the complementary-symmetry output device of the linear power amplifier as an equivalent active filter, and an extremely high attenuation characteristic can be achieved for removing the PWM carrier frequency component. It is therefore possible to reproduce an audio signal with substantially no high frequency noise at the output terminal of the high efficiency power amplifying apparatus.

A signal input from a signal input terminal can also be phase compensated for the signal delay caused by the passive low-pass filter before being voltage amplified by means of a linear voltage amplifier, by using either a phase compensation circuit for phase compensation before voltage amplification, or by using a feedback circuit and an input circuit to an operational amplifier in the linear voltage amplifier before voltage amplification.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which.

DESCRIPTION OF THE PREFERRED EMBODIMENTS

The preferred embodiments of the present invention are described in detail below with reference to the accompanying figures.

Embodiment 1

Figure 1:
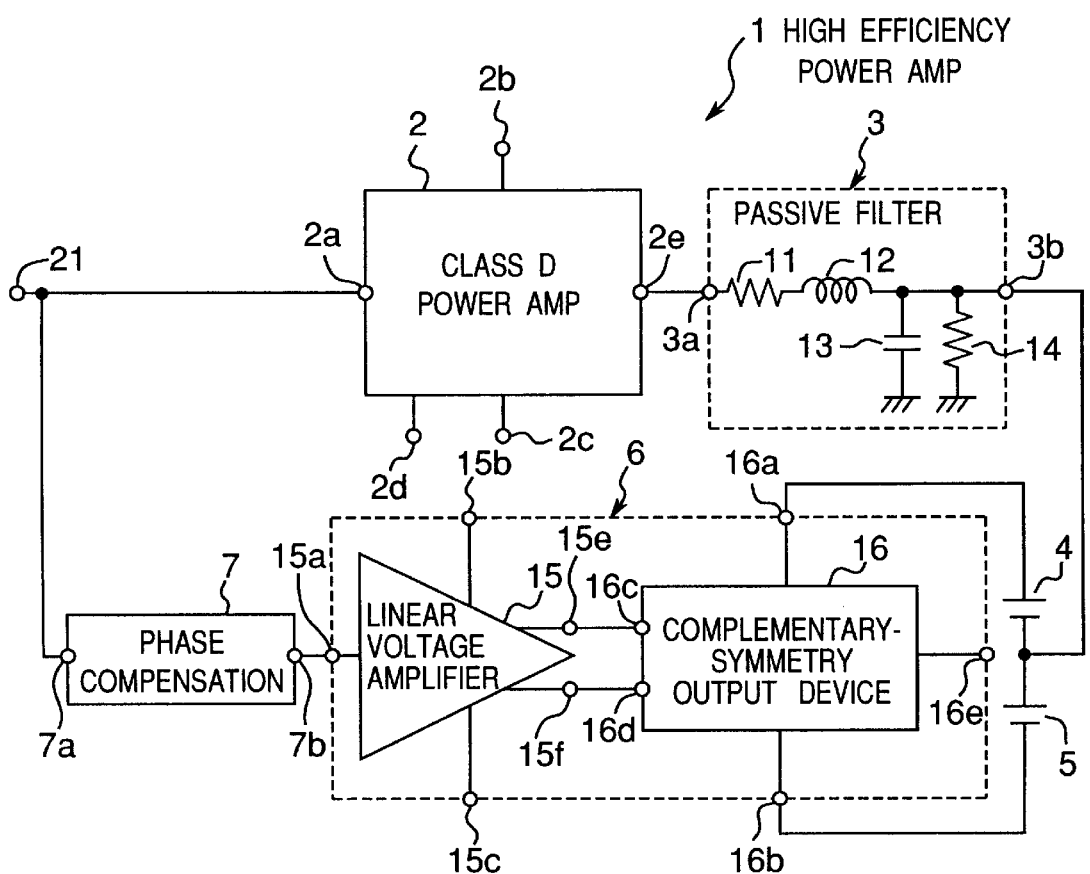
FIG. 1 is a block diagram showing the basic configuration of a high efficiency power amplifying apparatus according to a first embodiment of the present invention.

FIG. 1 is a block diagram showing the basic configuration of a high efficiency power amplifying apparatus according to a first embodiment of the present invention.

As shown in FIG. 1, a high efficiency power amplifying apparatus 1 according to the present invention comprises: a class D power amplifier 2 for audio signal power amplification; a passive filter 3, which is a low-pass filter for removing any unnecessary modulated carrier signal in the output from the class D power amplifier 2; a positive floating voltage source 4; a negative floating voltage source 5; a linear power amplifier 6 for audio signal power amplification; and a phase compensation circuit 7 having a phase characteristic similar to that of the passive filter 3 for phase compensating the audio signal applied to the linear power amplifier 6.

The passive filter 3 comprises a resistor 11 and coil 12 in a series circuit with a capacitor 13 and terminating resistor 14 parallel connected to this series circuit.

The linear power amplifier 6 comprises a linear voltage amplifier 15 with a linear circuit design, and a complementary-symmetry output device 16 comprising a complementary-symmetry circuit functioning as a push-pull circuit. The complementary-symmetry output device 16 supplies current to the speaker (not shown in the figures) according to the audio signal that is voltage amplified by the linear voltage amplifier 15.

Signal input terminal 21 of the high efficiency power amplifying apparatus 1 is connected to input terminal 2a of the class D power amplifier 2, and to the input terminal 7a of the phase compensation circuit 7.

The class D power amplifier 2 further comprises positive supply terminal 2b, negative supply terminal 2c, control input terminal 2d to which a control signal is applied from an external source, and output terminal 2e, which is connected to the input terminal 3a of the passive filter 3.

The positive floating voltage source 4 is connected between the output terminal 3b of the passive filter 3 and positive supply terminal 16a of the complementary-symmetry output device 16. The negative floating voltage source 5 is connected between the output terminal 3b of the passive filter 3 and the negative supply terminal 16b of the complementary-symmetry output device 16.

The output terminal 7b of the phase compensation circuit 7 is connected to the input terminal 15a of the linear voltage amplifier 15.

The linear voltage amplifier 15 further comprises positive supply terminal 15b, negative supply terminal 15c, and two output terminals 15e and 15f. The output terminals 15e and 15f are connected to input terminals 16c and 16d, respectively, of the complementary-symmetry output device 16. A speaker is connected to the output terminal 16e of the complementary-symmetry output device 16.

Figure 2:
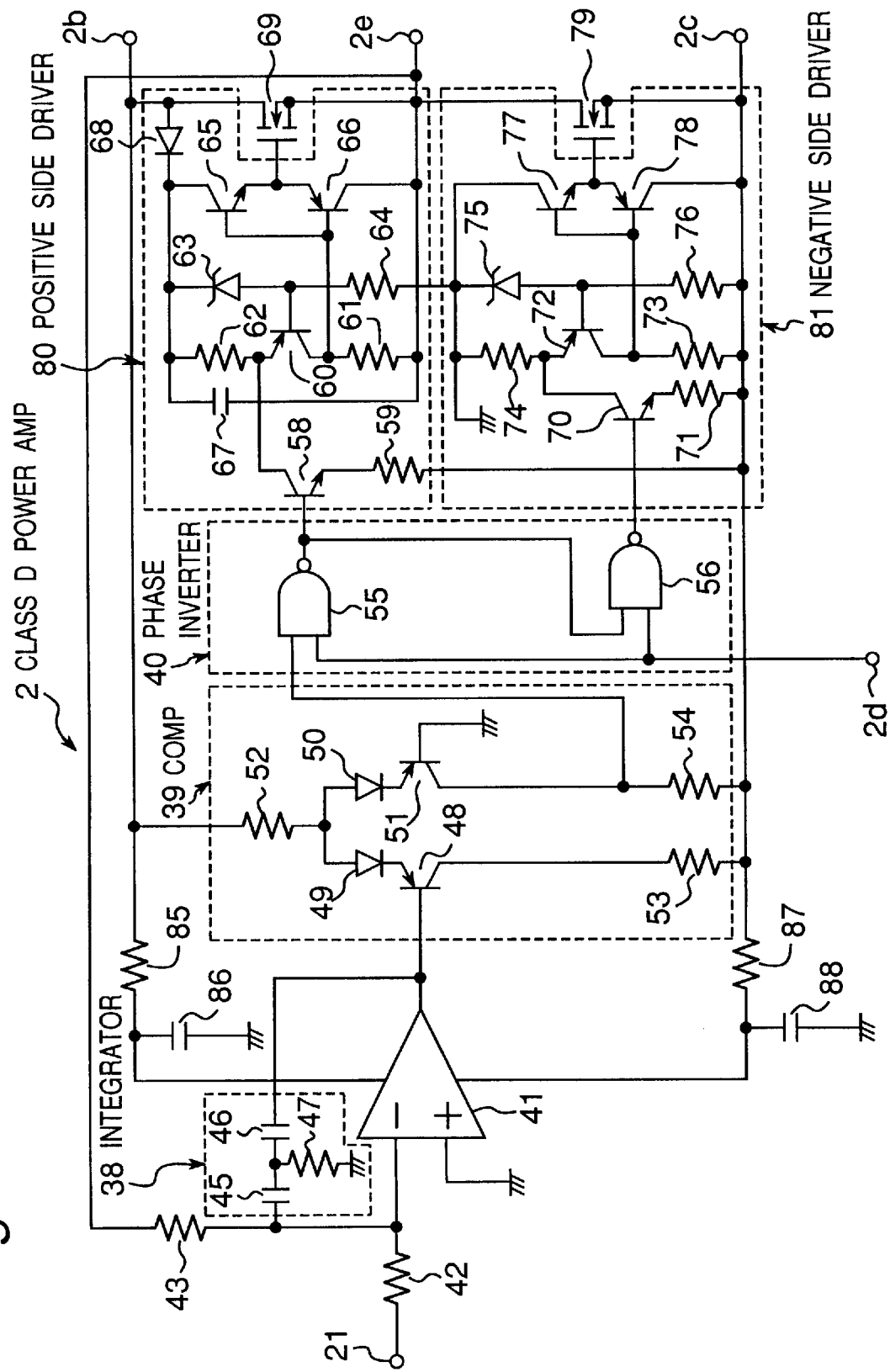
FIG. 2 is a typical circuit diagram of the class D power amplifier 2 shown in FIG. 1.

FIG. 2 is a typical circuit diagram of the class D power amplifier 2 shown in FIG. 1. A class D power amplifier 2 in this first preferred embodiment of the present invention is a PWM power amplifier for power amplification by means of pulse width modulation. The basic operation of the class D power amplifier 2 is described next below.

Shown in FIG. 2 are: an operational amplifier 41; resistors 42 and 43, which determine the voltage gain of the class D power amplifier 2; and an integrator 38 comprising capacitors 45 and 46 and resistor 47. The integrator 38 and operational amplifier 41 form an integrating circuit. In addition, a comparator 39 comprises pnp transistors 48 and 51, diodes 49 and 50, and resistors 52, 53, and 54. A phase inverter 40 for generating a phase inversion pulse comprises NAND gates 55 and 56. A control signal for controlling stopping PWM carrier switching by class D power amplifier 2 is applied through control signal input terminal 2d. Though not shown in FIG. 2, the control input terminal 2d is pulled up by, for example, the pull-up resistors in the class D power amplifier 2.

An n-channel power MOS transistor 69 functions as a positive power switch. A positive side driver 80 for switching the n-channel power MOS transistor 69 on and off comprises npn transistors 58 and 65, pnp transistors 60 and 66, resistors 59, 61, 62, and 64, Zener diode 63, capacitor 67 and diode 68.

An n-channel power MOS transistor 79 functions as a negative power switch. A negative side driver 81 for switching the n-channel power MOS transistor 79 on and off comprises npn transistors 70 and 77, pnp transistors 72 and 78, resistors 71, 73, 74, and 76, and Zener diode 75.

An audio signal input from the signal input terminal 21 is converted to a sawtooth wave by the integrating circuit formed by the integrator 38 and operational amplifier 41. This sawtooth wave is then converted to a rectangular wave by comparator 39. When the control input terminal 2d is pulled down, both NAND gates 55 and 56 of the phase inverter 40 go high, and signal output from the output terminal 2e stops.

Figure 3:
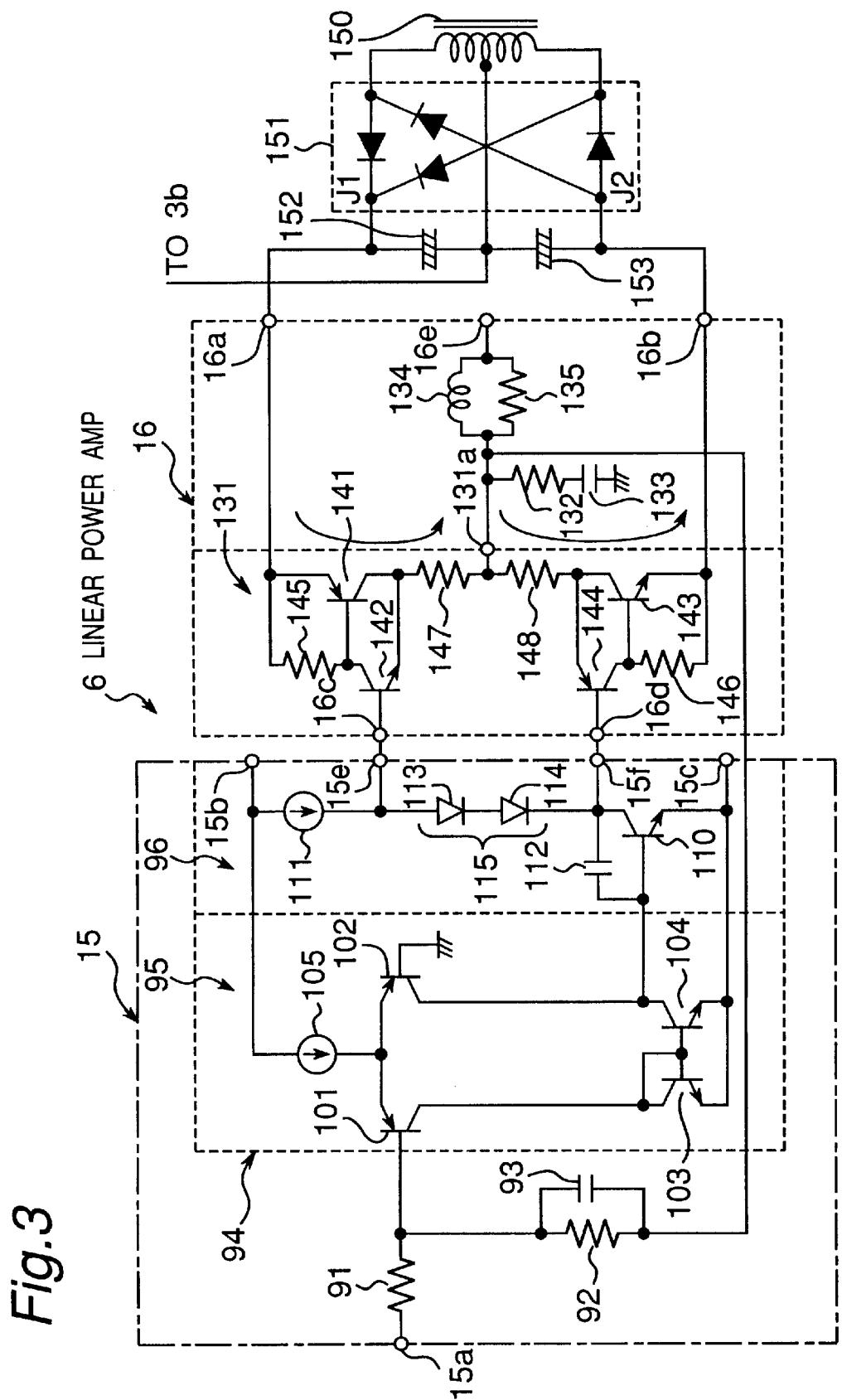
FIG. 3 is a typical circuit diagram showing the basic configuration of the linear power amplifier 6 shown in Fig.

FIG. 3 is a typical circuit diagram showing the basic configuration of the linear power amplifier 6 shown in FIG. 1.

Referring to FIG. 3, a linear voltage amplifier 15 comprises resistors 91 and 92, capacitor 93, and operational amplifier 94. The operational amplifier 94 comprises a first voltage amplifier stage 95, and a second voltage amplifier stage 96. Resistors 91 and 92 determine the voltage gain of the linear power amplifier 6. Capacitor 93 is a phase compensation capacitor.

The first voltage amplifier stage 95 comprises pnp transistors 101 and 102, npn transistors 103 and 104, and a constant current supply 105; pnp transistors 101 and 102 form a differential amplifier, and npn transistors 103 and 104 form a current mirror circuit. The base of pnp transistor 101 is the inverting input terminal of operational amplifier 94, and the base of pnp transistor 102 is the non-inverting input terminal of the operational amplifier 94.

The second voltage amplifier stage 96 comprises npn transistor 110, constant current supply 111, capacitor 112, and diodes 113 and 114. The capacitor 112 is a phase compensating capacitor, and functions as the control pole of the linear voltage amplifier 15. Diodes 113 and 114 form a constant voltage bias diode group 115 that determines the bias current of the complementary-symmetry output device 16.

The complementary-symmetry output device 16 comprises a complementary-symmetry circuit as a push-pull circuit 131; a resistor 132 and capacitor 133 for assuring the load stability of the complementary-symmetry output device 16; and a coil 134 and damping resistor 135 for assuring the stability of the speaker load. The push-pull circuit 131 comprises a pnp power transistor 141, an npn transistor 142 for driving the pnp power transistor 141, an npn power transistor 143, a pnp transistor 144 for driving the npn power transistor 143, and resistors 145 to 148.

Power transistors 141 and 143 are complementary, as are transistors 142 and 144. Resistor 145 provides the collector resistance of npn transistor 142, and resistor 146 provides the collector resistance of pnp transistor 144. Resistor 147 is both the collector resistance of pnp power transistor 141 and the emitter resistance of npn transistor 142. Resistor 148 is both the collector resistance of npn power transistor 143 and the emitter resistance of pnp transistor 144.

Transformer 150, diode bridge circuit 151, and smoothing capacitors 152 and 153 form a floating voltage source. Capacitor 152, transformer 150, and bridge circuit 151 correspond to the positive floating voltage source 4 shown in FIG. 1, and capacitor 153, transformer 150, and bridge circuit 151 correspond to the negative floating voltage source 5 shown in FIG. 1.

A forward current flowing from the emitter of pnp power transistor 141 to the collector, and then to the output terminal 131a of the push-pull circuit 131, is supplied from node J1 of bridge circuit 151. A reverse current flowing from the output terminal 131a of push-pull circuit 131 to the collector of npn power transistor 143, then from the collector of npn power transistor 143 through the emitter to node J2, is simultaneously supplied from node J2 of the bridge circuit 151. The currents flowing through pnp power transistor 141 and npn power transistor 143 are thus in a push-pull relationship.

Figure 4:
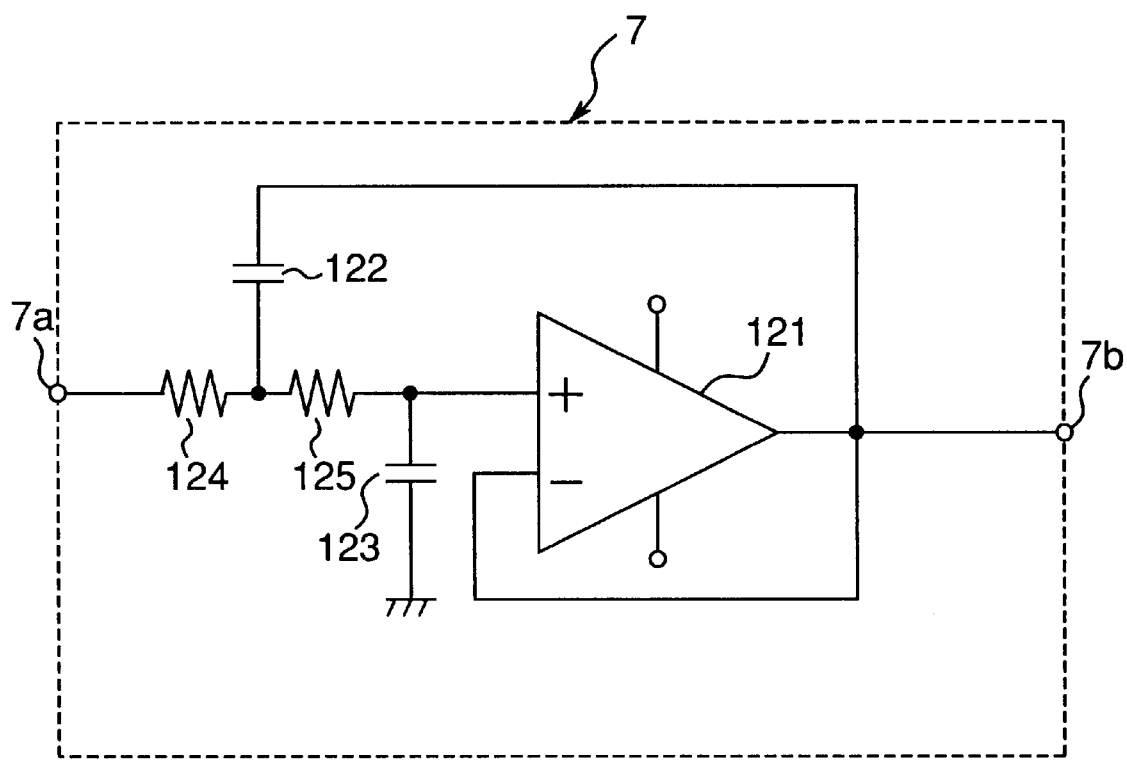
FIG. 4 shows a typical circuit diagram of the phase compensation circuit 7 shown in FIG. 1.

FIG. 4 shows a typical circuit diagram of the phase compensation circuit 7 shown in FIG. 1.

As shown in FIG. 4, this phase compensation circuit 7 comprises an operational amplifier 121, capacitors 122 and 123, and resistors 124 and 125, and forms an active low-pass filter using operational amplifier 121. The passive filter 3 shown in FIG. 1 is a two pole filter, and the active filter forming the phase compensation circuit 7 is therefore also a two pole filter. The active filter forming the phase compensation circuit 7 thus has the same number of poles as the passive filter 3.

The operation of a high efficiency power amplifying apparatus 1 thus comprised is described next below.

An audio signal input to the signal input terminal 21 is simultaneously applied to the class D power amplifier 2 and phase compensation circuit 7. The class D power amplifier 2 uses half-bridge type high speed switching power MOS transistors 69 and 79 to operate as a high speed, high efficiency PWM switching amplifier.

Figure 5A:
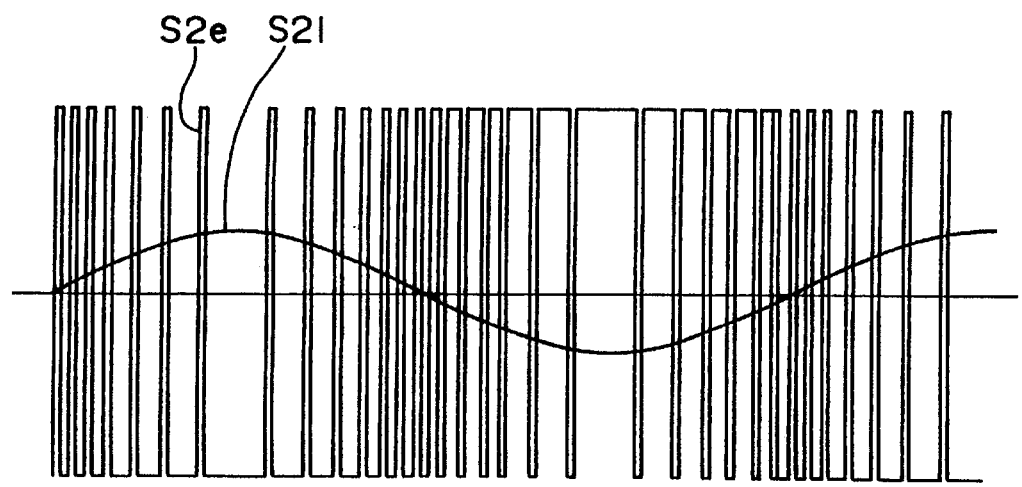
FIGS. 5A and 5B are signal waveform diagrams of signals at major points in FIG. 1.
Figure 5B:
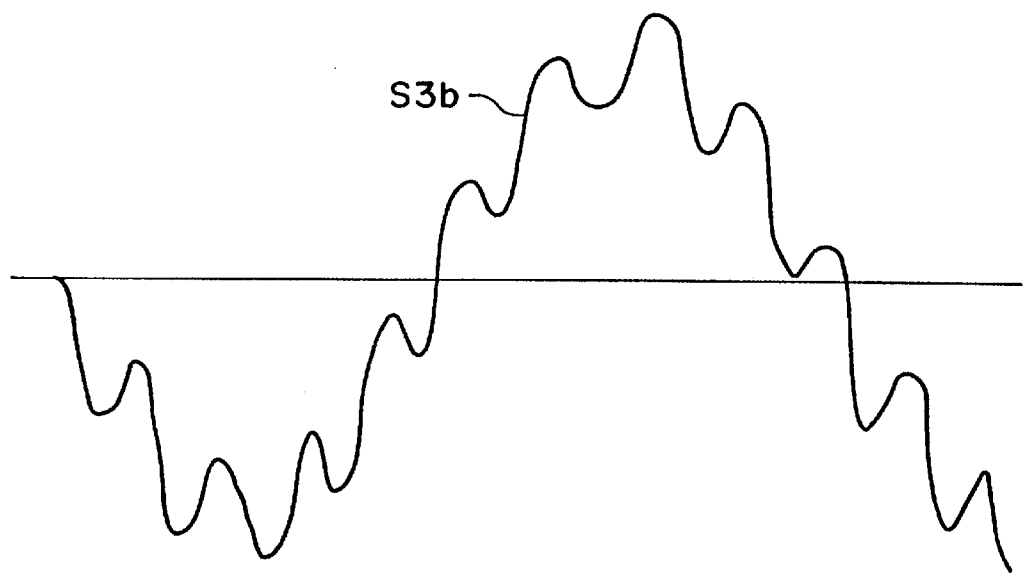

Wave S21 in FIG. 5(a) is the audio signal (shown by way of example as a simple sine wave) input to the signal input terminal 21, and wave S2e is the PWM modulated output wave after power amplification by the class D power amplifier 2. Wave S3b in FIG. 5(b) is the output wave from the output terminal 3b of passive filter 3. The passive filter passive filter 3 demodulates the PWM signal to restore the original audio signal, except that, as shown in FIG. 5(b), a high frequency noise component is superimposed on the original audio signal.

Figure 6:
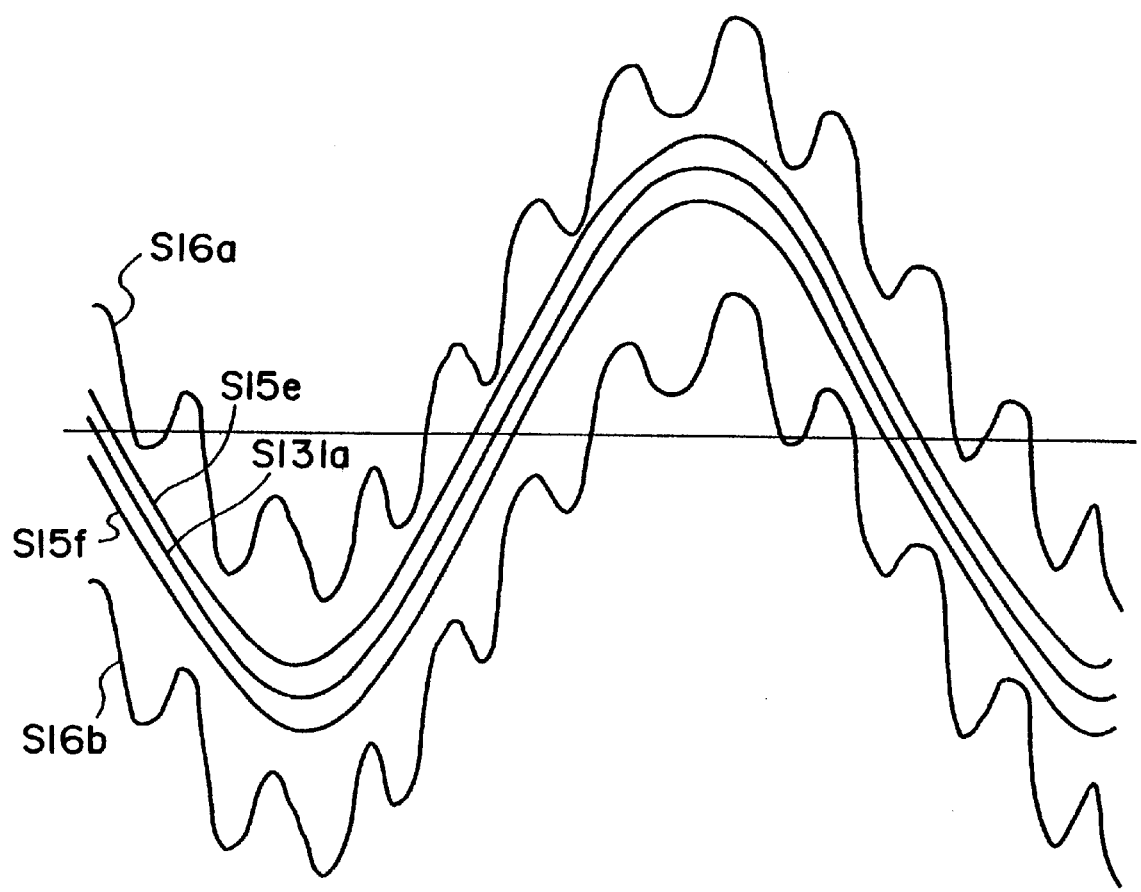
FIG. 6 is a signal waveform diagram of signals at major points in FIG. 1.

The phase of the audio signal applied to the phase compensation circuit 7 is compensated by the phase compensation circuit 7 shown in FIG. 4, and is then voltage amplified by the linear voltage amplifier 15 shown in FIG. 3. A bias voltage of +dV and −dV (+5V and −5V, for example) is added by the constant voltage bias diode group 115 of diodes 113 and 114, generating the high side voltage amplified signal S15e output from output terminal 15e, and the low side voltage amplified signal S15f output from output terminal 15f, as shown in FIG. 6. The high side voltage amplified signal S15e and low side voltage amplified signal S15f each have the same waveform as the input signal S21, but are offset by a 2dV voltage potential. Signal S15e is applied to input terminal 16c, and signal S15f is applied to input terminal 16d, of the complementary-symmetry output device 16.

Signal S3b from output terminal 3b of the passive filter 3 is forward and reverse shifted, and applied respectively to the positive supply terminal 16a and negative supply terminal 16b of the complementary-symmetry output device 16. More specifically, signal S3b is shifted by capacitors 152 and 153 +DV and −DV (+10V and −10V, for example), and the resulting signals are applied to supply terminals 16a and 16b. Wave S16a and S16b in FIG. 6 represent the voltage waves applied to supply terminals 16a and 16b, and have the same waveform. As will also be known from FIG. 6, waves S16a and S16b are preferably as close as possible to, and above and below waves S15e and S15f while not overlapping.

Of the audio signals voltage amplified by the linear voltage amplifier 15, wave S15e represents the current amplified output of the pnp power transistor 141. This current is the forward current supplied from node J1 of bridge circuit 151, and flows from the emitter of pnp power transistor 141 to the collector, and to the output terminal 131a of the push-pull circuit 131. Wave S15f likewise represents the current amplified signal of npn power transistor 143. Current in this case is supplied from node J2 of the bridge circuit 151, and is a reverse current flowing from the output terminal 131a of push-pull circuit 131 to the collector of npn power transistor 143, and from the collector to the emitter.

More specifically, the pnp power transistor 141 current amplifies the high side voltage amplified signal S15e using the forward current from node J1, and thus generates a forward current amplified signal. The npn power transistor 143 current amplifies the low side voltage amplified signal S15f using the reverse current from node J2, and thus generates a reverse current amplified signal. These forward and reverse current amplified signals are applied in a push-pull fashion, and a power amplified signal is output from the output terminal 131a.

Because the power transistors 141 and 143 are configured in a push-pull relationship, the current flowing to pnp power transistor 141 and the current flowing to npn power transistor 143 is added to obtain the average current, which is output from the output terminal 131a of push-pull circuit 131. The voltage signal wave from push-pull circuit 131 is thus shown as wave S131a in FIG. 6, which is the midpoint between waves S15e and S15f.

Audio signal S21 can thus be faithfully power amplified. In addition, because the current supply for power amplification is limited to between waves S16a and S16b, the supply source current can be controlled to a low supply power when the current requirement is low, and to a high supply power when the current requirement is high. Current supply efficiency can thus be improved.

Figure 7:
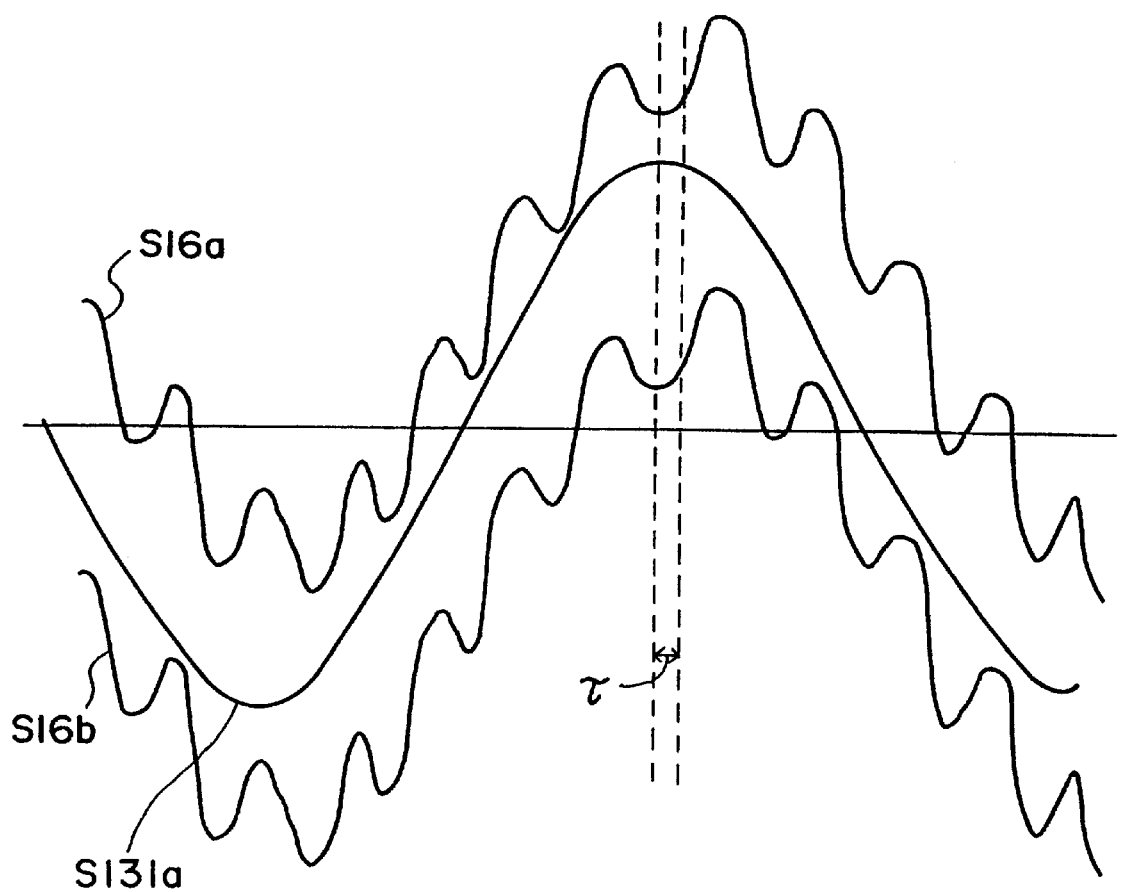
FIG. 7 is a waveform diagram used to describe the operation of the phase compensation circuit 7 shown in FIG. 1.

Note that the signal output from passive filter 3 shown in FIG. 5(b) is delayed by the passive filter 3 delay time τ from the original audio signal input from the signal input terminal 21. This means that when the audio signal applied to the signal input terminal 21 is input directly to the input terminal 15a of the linear voltage amplifier 15, both waveforms S16a and S16b are delayed by delay time τ from wave S131a as shown in FIG. 7.

The phase compensation circuit 7 therefore delays the audio signal applied from the signal input terminal 21 delay time τ before passing it to the input terminal 15a of the linear voltage amplifier 15. It will thus be obvious that by connecting an active filter with phase characteristics similar to those of the passive filter 3 connected to the output terminal 2e of the class D power amplifier 2 to the input terminal 15a of the linear voltage amplifier 15, it is possible to accurately track the audio signal to a high frequency, that is, a frequency above 10 kHz, for example, and to prevent distortion and interference noise resulting from phase shifting.

A more specific example is described next below. The PWM switching carrier frequency when there is no signal can be set to approximately 500 kHz, significantly above the 20 kHz upper limit of the audio signal frequency range. It is also possible to develop a power amplifier with nearly 90% power efficiency. The voltage gain of this self-excited class D power amplifier 2 is determined by the ratio between resistor 42 and resistor 43. If the resistance of resistor 42 is R42, and the resistance of resistor 43 is R43, then the voltage gain of the class D power amplifier 2=R43/R42.

As noted above, the audio signal input to the linear power amplifier 6 is voltage amplified by the linear voltage amplifier 15. Voltage is supplied from a fixed supply to positive supply terminal 15b and negative supply terminal 15c of the linear voltage amplifier 15. If this voltage can be supplied from a supply that is sufficiently free of high frequency noise, the linear voltage amplifier 15 can be expected to perform as a pure audio signal voltage amplifier with no high frequency noise.

Next, a pure audio output signal free of high frequency noise is applied to the complementary-symmetry output device 16 through first output terminal 15e and second output terminal 15f of the linear voltage amplifier 15. This audio output signal is power converted by the complementary-symmetry output device 16, and output from the output terminal 16e, which functions as the output terminal of the high efficiency power amplifying apparatus 1.

The voltage gain of this linear power amplifier 6 is determined by resistors 91 and 92. If the resistance of resistor 91 is R91, and the resistance of resistor 92 is R92, the voltage gain of the linear power amplifier 6=R92/R91.

The PWM signal at the output terminal 2e of class D power amplifier 2 is demodulated by the two-stage passive filter 3. If the PWM switching carrier frequency component can be attenuated approximately 40 dB, for example, an approximately 1V PWM switching carrier frequency component is produced at the output terminal 3b of the two-stage passive filter 3 assuming the amplitude of the PWM switching pulse is ±50V, for example. It is therefore possible to assume that an audio output signal with the same PWM switching carrier frequency component is applied by way of the positive floating voltage source 4 and negative floating voltage source 5 to the positive supply terminal 16a and negative supply terminal 16b of the complementary-symmetry output device 16.

If the voltage gain (=R43/R42) of the class D power amplifier 2, and the voltage gain (=R92/R91) of the linear power amplifier 6, are set to substantially the same voltage gain, the audio output signal can be kept at a voltage substantially midway between the positive floating voltage source 4 and the negative floating voltage source 5. Power loss can be minimized by minimizing the voltage of the positive floating voltage source 4 and the voltage of the negative floating voltage source 5. If operation is possible at ±5V, for example, power loss can be reduced to approximately 1/10 compared with a linear power amplifier operating at ±50V.

Figure 8:
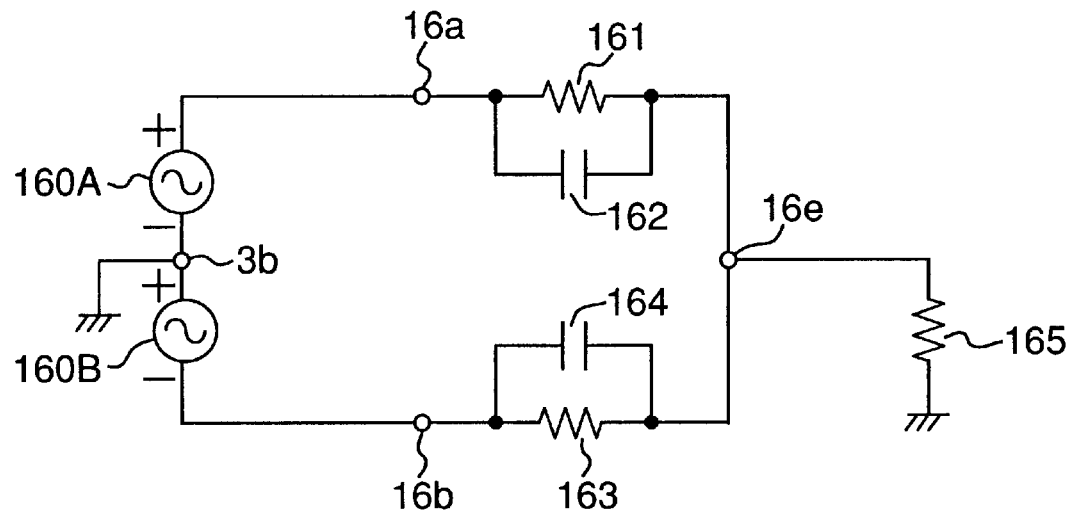
FIG. 8 is an equivalent circuit diagram used to describe the high frequency noise suppression principle of the complementary-symmetry output device 16 shown in FIG. 1.

The principle of high frequency noise suppression by the complementary-symmetry output device 16 is described next with reference to FIG. 8 and FIG. 9. FIG. 8 is an equivalent circuit diagram for describing the high frequency noise principle of the complementary-symmetry output device 16.

Shown in FIG. 8 are: a high frequency noise source 160A passing from positive floating voltage source 4 through positive supply terminal 16a of complementary-symmetry output device 16 to output terminal 16e of high efficiency power amplifying apparatus 1; high frequency noise source 160B passing from negative floating voltage source 5 through negative supply terminal 16b of complementary-symmetry output device 16 to the output terminal 16e of high efficiency power amplifying apparatus 1; positive equivalent output resistor 161 of the complementary-symmetry output device 16; positive equivalent output capacitance 162 of complementary-symmetry output device 16; negative equivalent output resistor 163 of the complementary-symmetry output device 16; negative equivalent output capacitance 164 of complementary-symmetry output device 16; and speaker terminal load resistance 165.

The operation of the equivalent circuit shown in FIG. 8 is described next. If output terminal 3b of two-stage passive filter 3 is a virtual ground, high frequency noise source 160A and high frequency noise source 160B are mutually inverse phase components. Therefore, if positive equivalent output resistor 161 and positive equivalent output capacitance 162 of complementary-symmetry output device 16, and negative equivalent output resistor 163 and negative equivalent output capacitance 164 of complementary-symmetry output device 16, are extremely well matched, a large attenuation factor can be achieved from a low frequency range to a high frequency range. A feedback type circuit with a high equivalent output resistance as in the present embodiment is therefore extremely well-suited as the circuit configuration of a complementary-symmetry output device 16 for effectively suppressing high frequency noise. In addition, considering the physical structure of a silicon power transistor, stray capacitance between the ground and collector is greater than between the ground and emitter because the collector is on the back side of the silicon. High frequency noise can therefore be better suppressed with the emitter at the high frequency noise source because of the lower stray capacitance to the ground.

Even more specifically, if the positive equivalent output resistance 161 is 10 kΩ, the negative equivalent output resistance 163 is 9 kΩ, and the speaker load resistance 165 is 10 Ω, for example, the high frequency noise suppression ratio will be 80 dB. If the noise source has a 1 V amplitude, noise can be suppressed to 1/10,000, or to 100 $\mu$V.

Figure 9:
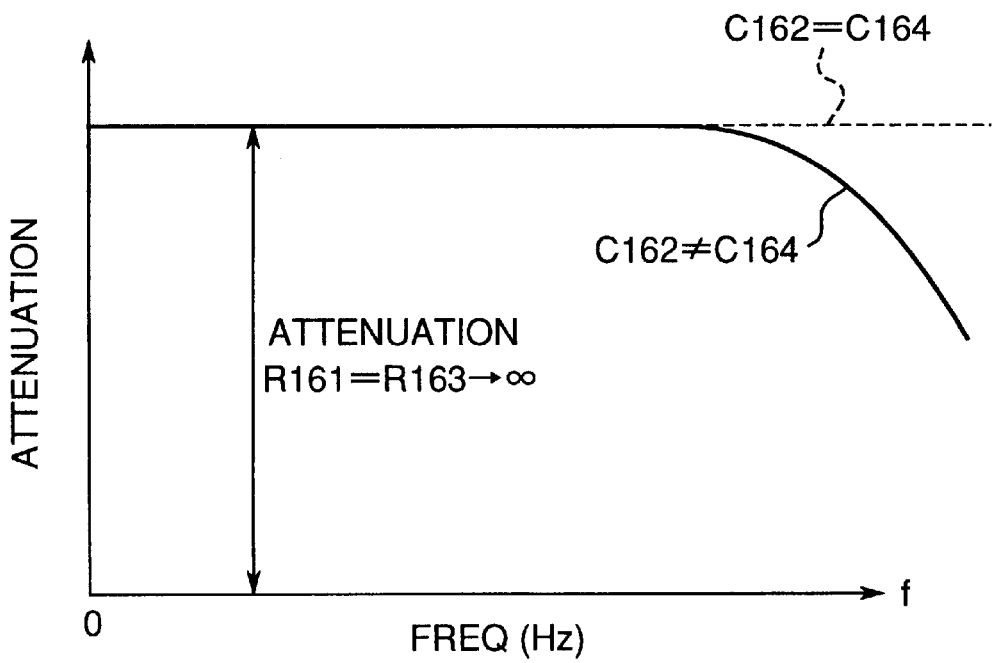
FIG. 9 shows the attenuation frequency characteristic of the complementary-symmetry output device 16 shown in FIG. 1.

FIG. 9 shows the frequency characteristic of complementary-symmetry output device 16 attenuation. As will be known from FIG. 9, if the positive equivalent output capacitance 162 and negative equivalent output capacitance 164 are perfectly matched, reliable attenuation to an infinite frequency can be expected.

The push-pull circuit 131 shown in FIG. 3 can also be configured for complementary-symmetry operation with a three-stage feedback type emitter-follower. A push-pull circuit 131 thus comprised is described next below with reference to a circuit diagram thereof in FIG. 10. The push-pull circuit 131 shown in FIG. 10 differs from that in Fig. 3 in that the pnp power transistor 141 is driven by pnp transistor 171, and pnp transistor 171 is driven by npn transistor 172; and npn power transistor 143 is driven by npn transistor 173, and npn transistor 173 is driven by pnp transistor 174.

Transistors 171 and 173 have complementary operating characteristics, as do transistors 172 and 174. Resistor 175 is an emitter resistance for pnp transistor 171, and resistor 176 is a collector resistance for npn transistor 172. In addition, resistor 177 is an emitter resistance for npn transistor 173, and resistor 178 is a collector resistance for pnp transistor 174. By thus configuring the push-pull circuit 131 as a complementary-symmetry, three-stage feedback type emitter-follower, a complementary-symmetry output device 16 with an even greater equivalent output resistance can be achieved.

Figure 10:
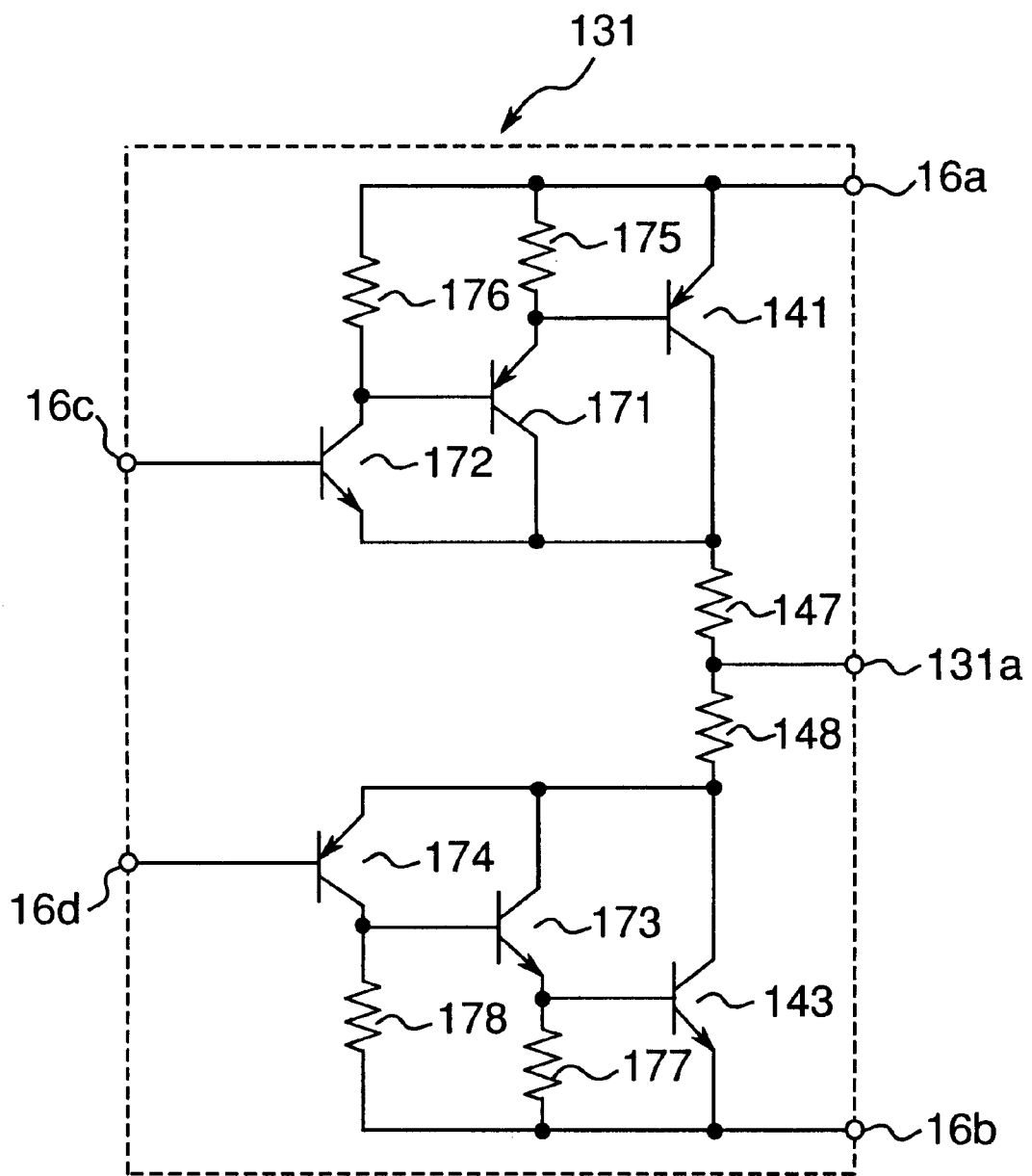
FIG. 10 is a circuit diagram of an alternative version of the push-pull circuit 131 shown in FIG. 3.

It should be further noted that while the push-pull circuit 131 shown in FIG. 3 and FIG. 10 is described by way of example as a complementary-symmetry, feedback type emitter-follower, it can be alternatively configured as a simple emitter-follower operating in a complementary-symmetry mode. An exemplary push-pull circuit 131a forming a two-stage emitter-follower for this case is shown in FIG. 11, and an exemplary push-pull circuit 131b forming a three-stage emitter-follower for this case is shown in FIG. 12.

Figure 11:
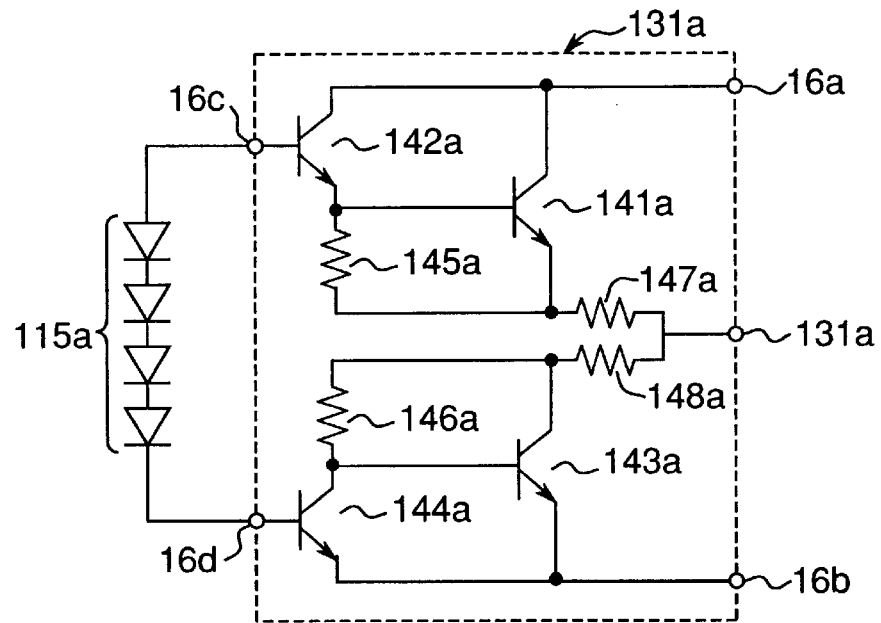
FIG. 11 is a circuit diagram of a further alternative version of the push-pull circuit 131 shown in FIG. 3.

Referring to FIG. 11, the push-pull circuit 131a comprises an npn power transistor 141a and npn transistor 142a for driving the power transistor 141a, npn power transistor 143a and npn transistor 144a for driving power transistor 143a, and resistors 145a to 148a.

Power transistors 141a and 143a have complementary operating characteristics, as do transistors 142a and 144a. Resistor 145a is an emitter resistance for npn transistor 142a, and resistor 146a is a collector resistance for npn transistor 144a and base resistance for power transistor 143a. Resistor 147a is an emitter resistance for power transistor 141a, and resistor 148a is a collector resistance for npn transistor 143a.

Figure 12:
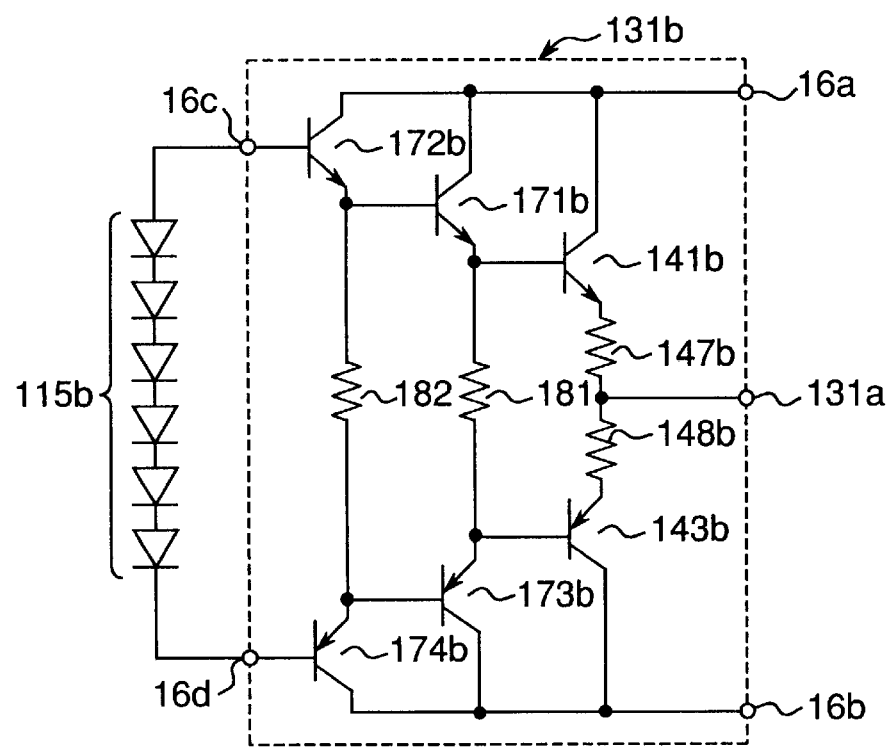
FIG. 12 is a circuit diagram of yet a further alternative version of the push-pull circuit 131 shown in FIG. 3.

Referring to FIG. 12, push-pull circuit 131b comprises pnp power transistor 141b, npn transistor 171b for driving power transistor 141b, npn transistor 172b for driving npn transistor 171b, pnp power transistor 143b, pnp transistor 173b for driving power transistor 143b, pnp transistor 174b for driving pnp transistor 173b, and resistors 147b, 148b, 181, and 182.

Power transistors 141b and 143b, transistors 171b and 173b, and transistors 172b and 174b each have complementary operating characteristics. Resistor 147b is an emitter resistance for power transistor 141b, and resistor 148b is an emitter resistance for pnp transistor 143b. Resistor 181 is an emitter resistance for transistors 171b and 173b, and resistor 182 is an emitter resistance for transistors 172b and 174b.

While the push-pull circuits shown in FIG. 11 and FIG. 12 do not have a greater equivalent output resistance than a feedback type emitter-follower, there is no concern about oscillation stability accompanying feedback, and a stable complementary-symmetry output device can be achieved. It should be further noted that, as shown in FIG. 11 and FIG. 12, a class A, class AB, or class B bias can be set by changing the bias, which can be accomplished by changing the number of diodes in the constant voltage bias diode group 115 of the linear power amplifier 6 determining the idling current of the push-pull circuit.

Figure 13:
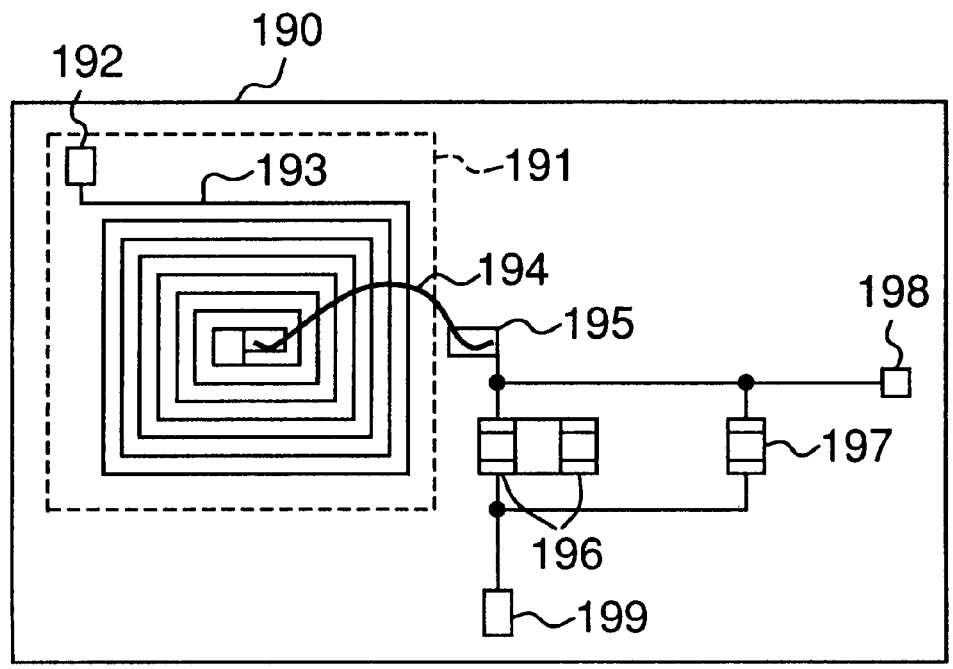
FIG. 13 shows an exemplary application of the passive filter 3 shown in FIG. 1.

A third preferred embodiment of the passive filter 3 shown in FIG. 1 is shown in FIG. 13 and described below.

Figure 14:
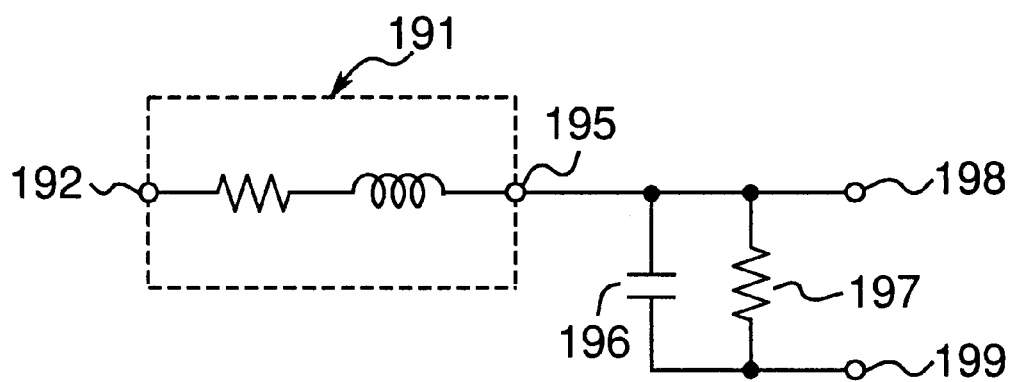
FIG. 14 is a circuit diagram of the passive filter shown in FIG. 13.
Figure 15:
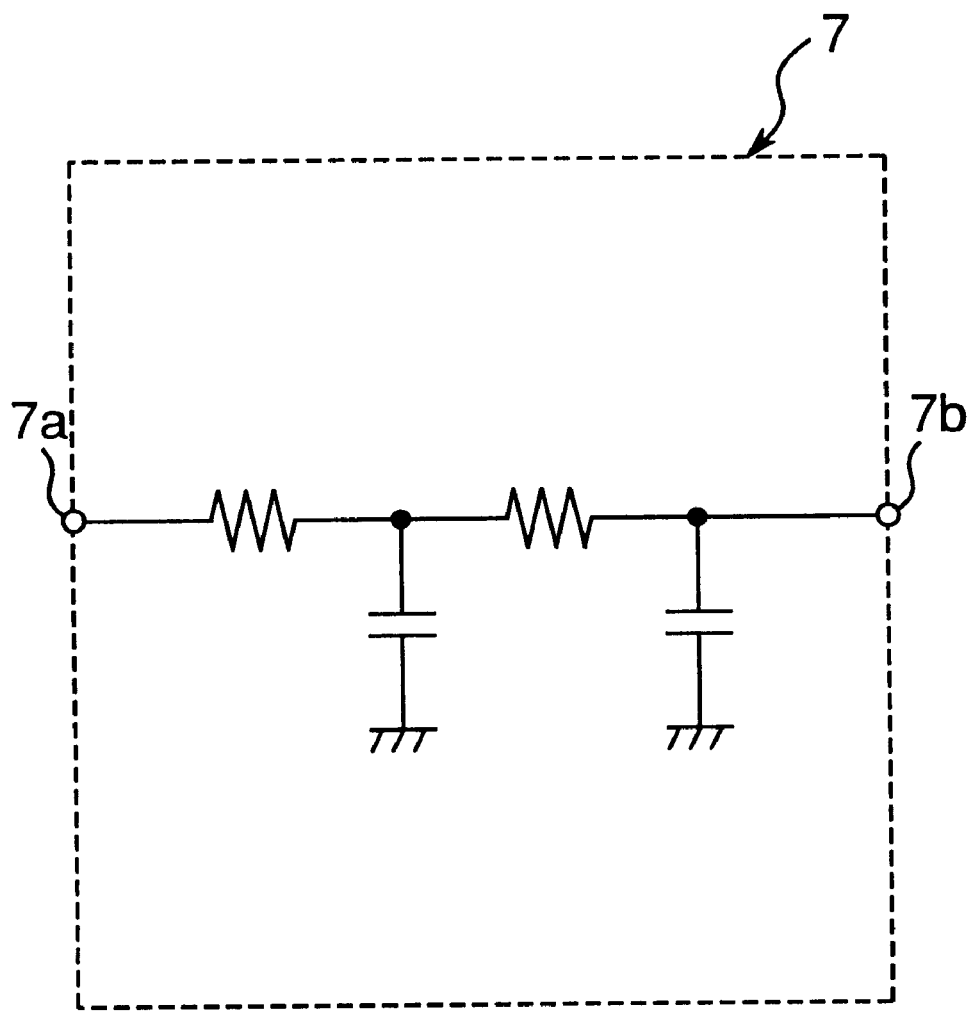
FIG. 15 is a circuit diagram of an alternative version of a phase compensation circuit 7 according to the present invention.

As shown in FIG. 13, an insulated copper foil pattern 191 is formed on a metallic substrate 190. Reference numeral 192 is an input terminal for the two-stage passive filter; 193 is a coil formed by a spiraling copper foil pattern having a constant pattern width; 194 is a wire bonded aluminum wire; 195 is a bonding pad; 196 is a chip capacitor; 197 is a chip resistor; 198 is an output terminal for the two-stage passive filter; and 199 is a ground contact for the two-stage passive filter. FIG. 14 is a circuit diagram for the passive filter shown in FIG. 13 where like parts are identified by like reference numerals.

FIG. 13 and FIG. 14 show the basic configuration for mounting a two-stage passive filter 3 on a metallic substrate. Using the copper foil sheet resistance and controlling the copper foil width, a coil with a specific equivalent serial resistance can be formed, and a high power chip resistance is not necessary. An extremely low cost, high reliability filter can thus be achieved using a two-stage passive filter 3 comprising a chip capacitor.

Embodiment 2

While phase compensation is accomplished in a high efficiency power amplifying apparatus 1 according to the above first preferred embodiment by means of a discrete phase compensation circuit 7, phase compensation can also be applied by the linear voltage amplifier. A high efficiency power amplifying apparatus thus comprised is described next below as the second preferred embodiment of the present invention.

Figure 16:
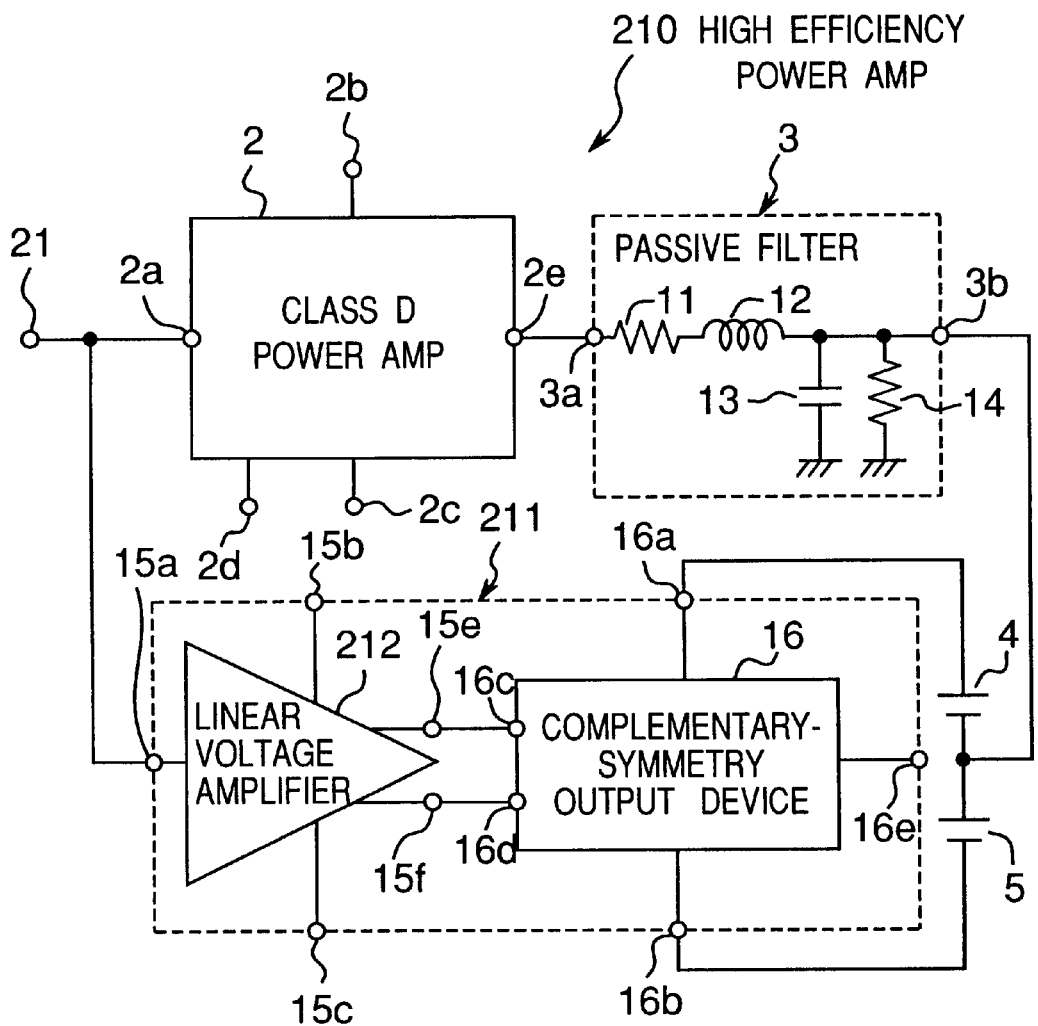
FIG. 16 is a block diagram showing the basic configuration of a high efficiency power amplifying apparatus according to a second embodiment of the present invention.

FIG. 16 is a typical block diagram showing the basic configuration of a high efficiency power amplifying apparatus according to this second preferred embodiment. It should be noted that like parts are indicated by like reference numerals in FIG. 1 and FIG. 16, and further description thereof is omitted below where only the differences between this and the above first embodiment are described.

The high efficiency power amplifying apparatus 1 shown in FIG. 16 differs from that in FIG. 1 in that the phase compensation circuit 7 is eliminated and the structure of the linear voltage amplifier 15 shown in FIG. 1 is changed so that phase compensation is accomplished by the linear voltage amplifier 15. The linear voltage amplifier 15 in FIG. 1 is therefore referred to as linear voltage amplifier 212. As a result, the linear power amplifier 6 in FIG. 1 is indicated as linear power amplifier 211, and the high efficiency power amplifying apparatus 1 in FIG. 1 is indicated as high efficiency power amplifying apparatus 210, in FIG. 16.

As shown in FIG. 16, a high efficiency power amplifying apparatus 210 according to this preferred embodiment of the present invention comprises: a class D power amplifier 2, a passive filter 3, a positive floating voltage source 4, a negative floating voltage source 5, and a linear power amplifier 6 for audio signal power amplification. The linear power amplifier 211 comprises a linear voltage amplifier 212 having a linear circuit design, and a complementary-symmetry output device 16. This linear voltage amplifier 212 performs the same operations as the linear voltage amplifier 15 shown in FIG. 1 while additionally phase compensating the audio signal applied from the signal input terminal 21.

Figure 17:
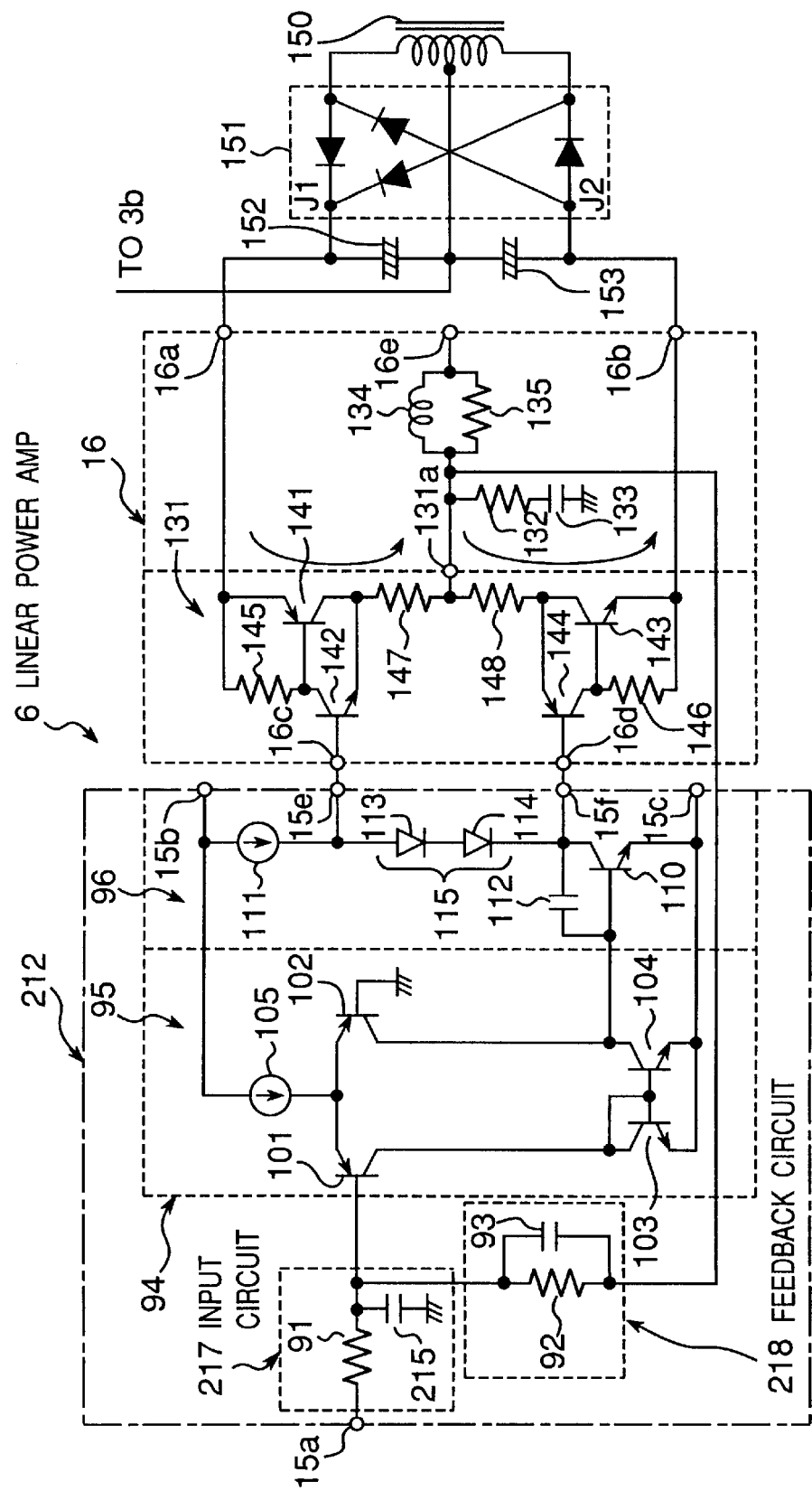
FIG. 17 is a typical circuit diagram of the linear voltage amplifier 212 shown in FIG. 16.

FIG. 17 is a circuit diagram of the linear voltage amplifier 212 shown in FIG. 16. It should be noted that like parts are indicated by like reference numerals in FIG. 17 and FIG. 3, and further description thereof is omitted below where only the differences between this and the linear voltage amplifier 15 shown in FIG. 3 are described.

The linear voltage amplifier 212 in FIG. 17 differs from that in FIG. 3 in the addition of capacitor 215 at resistor 91 between ground and the inverting input to operational amplifier 94.

Resistor 91 and capacitor 215 form an input circuit 217 to the operational amplifier 94, and resistor 92 and capacitor 93 form a feedback circuit 218 for the operational amplifier 94. Input circuit 217 and feedback circuit 218 are each equivalent to a filter pole, and the phase of an audio signal input from signal input terminal 21 can be compensated by adjusting the values of the resistors and capacitors in the input circuit 217 and feedback circuit 218.

It is therefore possible for the linear voltage amplifier to phase compensate an audio signal input from the signal input terminal 21. Cost can therefore be reduced because it is not necessary to provide a separate phase compensation circuit.

It should be noted that while the present embodiment has been described using a two pole passive filter 3 by way of example, the present invention shall not be so limited. More specifically, the passive filter 3 can be a filter having n poles, where n is a natural number, with the number of input circuits 217 and feedback circuits 218 in the linear voltage amplifier 212 equalling the number of passive filter 3 poles.
Embodiment 3

It is difficult to further increase the degree of integration and thereby lower the cost of a high efficiency power amplifying apparatus 1 according to the above first and second preferred embodiments of the present invention because a transformer 150, diode bridge circuit 151, and smoothing capacitors 152 and 153 are used to form positive floating voltage source 4 and negative floating voltage source 5. A high efficiency power amplifying apparatus according to this third preferred embodiment of the present invention achieves the same benefits as the first and second embodiments while eliminating use of components that make it difficult to achieve greater device integration. It should be further noted that while this third embodiment is described below with reference to the first embodiment above, it can be similarly applied to the above second embodiment, and further description thereof is thus omitted below.

Figure 18:
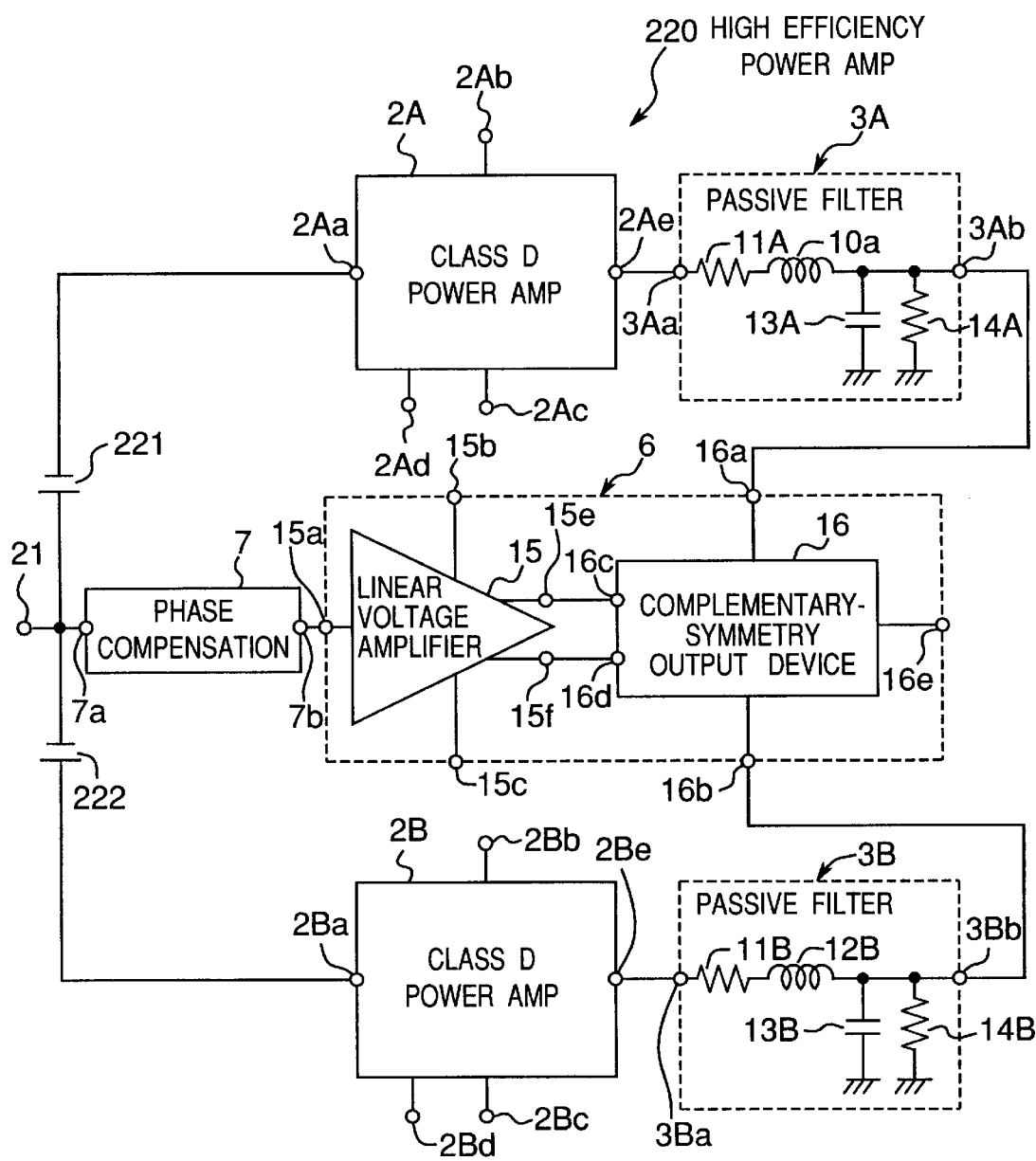
FIG. 18 is a block diagram showing the basic configuration of a high efficiency power amplifying apparatus according to a third embodiment of the present invention.
Figure 19:
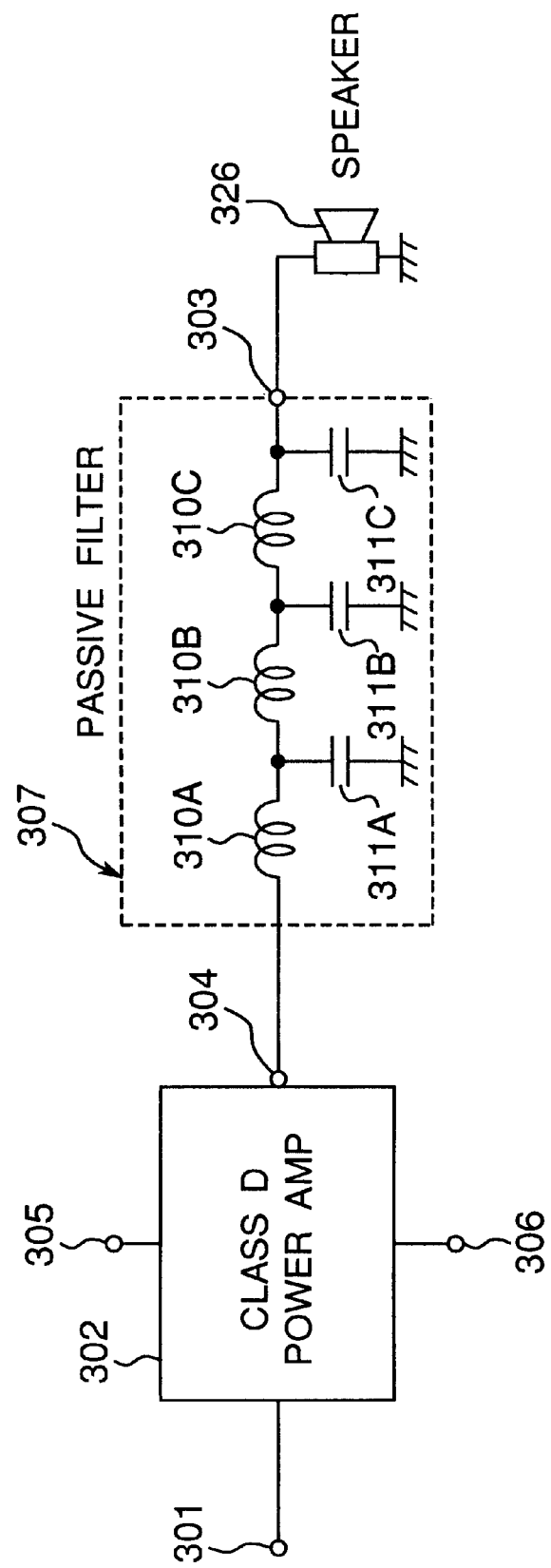
FIG. 19 shows the basic configuration of a high efficiency power amplifying apparatus according to the related art.
Figure 20:
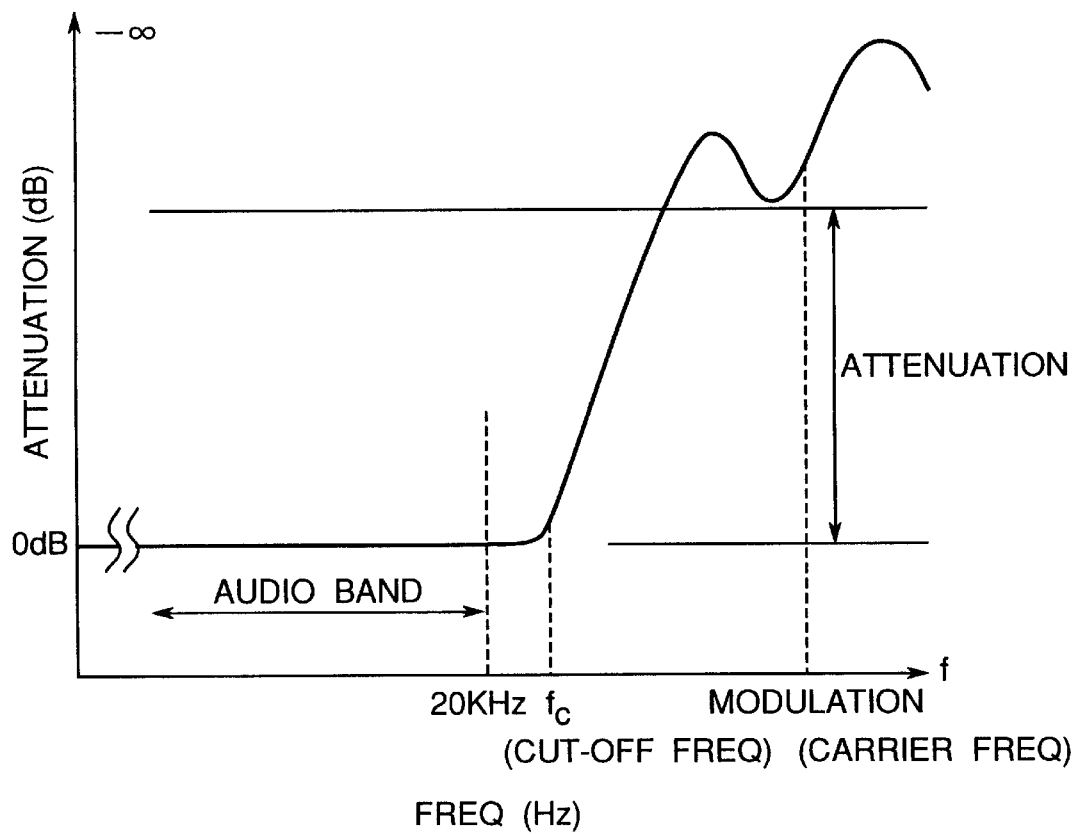
FIG. 20 is a waveform diagram showing the typical characteristics of a passive filter according to the related art.

FIG. 18 is a typical block diagram showing the basic configuration of a high efficiency power amplifying apparatus according to this third embodiment of the present invention. It should be noted that like parts in this and the first embodiment in FIG. 1 are identified by like reference numerals, and further description thereof is omitted below.

The high efficiency power amplifying apparatus 220 according to this third preferred embodiment as shown in FIG. 18 differs from that in FIG. 1 in that the positive floating voltage source 4 and negative floating voltage source 5 are eliminated, two qualitatively identical class D power amplifiers 2A and 2B are provided, and two passive filters 3A and 3B are provided. In addition, a first bias supply 221 and second bias supply 222 are provided on the signal input terminal 21 side.

As shown in FIG. 18, output terminal 3Ab of the one passive filter 3A is connected to positive supply terminal 16a of complementary-symmetry output device 16, and first bias supply 221 is connected between input terminal 2Aa of class D power amplifier 2A, which is connected to passive filter 3A, and input terminal 7a of phase compensation circuit 7. In addition, output terminal 3Bb of the other passive filter 3B is connected to negative supply terminal 16b of complementary-symmetry output device 16, and the second bias supply 222 is connected between input terminal 7a of phase compensation circuit 7 and input terminal 2Ba of the class D power amplifier 2B connected to the passive filter 3B.

The linear power amplifier 6 and phase compensation circuit 7 of the high efficiency power amplifying apparatus 220 shown in FIG. 18 are the same as those shown in FIG. 1 and FIG. 3. Class D power amplifiers 2A and 2B are also qualitatively identical to the class D power amplifier 2 shown in FIG. 1 and FIG. 2. In addition, passive filters 3A and 3B are qualitatively identical to the passive filter 3 shown in FIG. 1. Compared with the high efficiency power amplifying apparatus 1 shown in FIG. 1, however, noticeably greater current flows to each of the class D power amplifiers and passive filters. The transformer 150, diode bridge circuit 151, and smoothing capacitors 152 and 153 shown in FIG. 3 for the first embodiment are therefore not needed. Both the circuit scale and cost can therefore be reduced compared with a high efficiency power amplifying apparatus according to the first embodiment above.

As will be known from the preceding description, a high efficiency power amplifier with extremely low high frequency noise can be achieved without sacrificing high efficiency by inserting an equivalent active filter to the demodulating part of the class D power amplifier. In addition to audio signal amplification, a high efficiency power amplifying apparatus according to the present invention can therefore be used in a wide range of applications throughout the power control field where high efficiency is required.

A signal input from a signal input terminal can also be phase compensated for the signal delay caused by the passive low-pass filter before being voltage amplified by means of a linear voltage amplifier, by using either a phase compensation circuit for phase compensation before voltage amplification, or by using a feedback circuit and an input circuit to an operational amplifier in the linear voltage amplifier before voltage amplification. When applied in an audio signal amplifier, in particular, this makes it possible to accurately track high frequency audio signals, that is, frequencies of 10 kHz and above, and to prevent distortion and interference noise caused by phase shifting.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A high efficiency power amplifying apparatus for power amplifying an input signal applied to a signal input terminal, comprising:
    a PWM power amplifier for power amplifying an input signal from a signal input terminal by pulse width modulation;
    a passive low-pass filter for demodulating and outputting a pulse width modulated signal output from the PWM power amplifier;
    a positive floating voltage source for shifting a demodulated signal output from the passive low-pass filter a specific voltage +DV, and supplying a forward current;
    a negative floating voltage source for shifting a demodulated signal output from the passive low-pass filter a specific voltage −DV, and supplying a reverse current;
    a phase compensation circuit for phase compensating an input signal applied from the signal input terminal;
    a linear voltage amplifier comprising a linear circuit for voltage amplifying a signal phase compensated by the phase compensation circuit, shifting the amplified signal a specific voltage +dV and −dV, and outputting the shifted amplified signals; and
    an output device for current amplifying the +dV shifted voltage amplified signal by said forward current to generate a forward current amplified signal,
    current amplifying a −dV shifted voltage amplified signal by said reverse current to generate a reverse current amplified signal, and
    applying said forward current amplified signal and reverse current amplified signal in a push-pull fashion to generate a power amplified signal.

2. The high efficiency power amplifying apparatus as set forth in claim 1, wherein the output device is a push-pull circuit comprising a complementary-symmetry circuit.

3. The high efficiency power amplifying apparatus as set forth in claim 1, wherein the linear voltage amplifier and output device function as a class B power amplifier.

4. The high efficiency power amplifying apparatus as set forth in claim 1, wherein the linear voltage amplifier and output device function as a class AB power amplifier.

5. The high efficiency power amplifying apparatus as set forth in claim 1, wherein the linear voltage amplifier and output device function as a class A power amplifier.

6. The high efficiency power amplifying apparatus as set forth in claim 1, wherein the passive low-pass filter comprises a spiral shaped electrode formed on a substrate.

7. The high efficiency power amplifying apparatus as set forth in claim 6, wherein the spiral shaped electrode is a copper foil pattern forming a coil.

8. The high efficiency power amplifying apparatus as set forth in claim 1, wherein the phase compensation circuit is a passive filter having a same number of poles as said passive low-pass filter.

9. The high efficiency power amplifying apparatus as set forth in claim 1, wherein the phase compensation circuit is an active filter having a same number of poles as said passive low-pass filter.

10. The high efficiency power amplifying apparatus as set forth in claim 1, wherein the phase compensation circuit is within the linear voltage amplifier.

11. The high efficiency power amplifying apparatus as set forth in claim 10, wherein the linear voltage amplifier comprises:

an operational amplifier for voltage amplifying a signal applied to the signal input terminal;

an input circuit for adjusting an input impedance to the operational amplifier; and a feedback circuit to the operational amplifier;

said input circuit and feedback circuit each having a capacitor and a specific circuit constant such that a specific phase compensation is applied to a signal from the signal input terminal.

12. The high efficiency power amplifying apparatus as set forth in claim 11, wherein the input circuit and feedback circuit are comprised to effect a same number of poles as said passive low-pass filter.

13. A high efficiency power amplifying apparatus for power amplifying an input signal applied to a signal input terminal, comprising:

a first bias supply for applying a forward bias voltage to an input signal from the signal input terminal;

a first PWM power amplifier for power amplifying the forward biased input signal by pulse width modulation to generate a first pulse width modulated signal;

a first passive low-pass filter for demodulating the first pulse width modulated signal to generate and output a first demodulated signal;

a second bias supply for applying a reverse bias voltage to an input signal from the signal input terminal;

a second PWM power amplifier for power amplifying the reverse biased input signal by pulse width modulation to generate a second pulse width modulated signal;

a second passive low-pass filter for demodulating the second pulse width modulated signal to generate and output a second demodulated signal;

a phase compensation circuit for phase compensating an input signal applied from the signal input terminal;

a linear voltage amplifier comprising a linear circuit for voltage amplifying a signal phase compensated by the phase compensation circuit, shifting the amplified signal a specific voltage +dV and −dV, and outputting the shifted amplified signals; and an output device for current amplifying a +dV shifted voltage amplified signal by said first demodulated signal to generate a forward current amplified signal, current amplifying a −dV shifted voltage amplified signal by said second demodulated signal to generate a reverse current amplified signal, and applying said forward current amplified signal and reverse current amplified signal in a push-pull fashion to generate a power amplified signal.

14. The high efficiency power amplifying apparatus as set forth in claim 13, wherein the output device is a push-pull circuit comprising a complementary-symmetry circuit.

15. The high efficiency power amplifying apparatus as set forth in claim 13, wherein the linear voltage amplifier and output device function as a class B power amplifier.

16. The high efficiency power amplifying apparatus as set forth in claim 13, wherein the linear voltage amplifier and output device function as a class AB power amplifier.

17. The high efficiency power amplifying apparatus as set forth in claim 13, wherein the linear voltage amplifier and output device function as a class A power amplifier.

18. The high efficiency power amplifying apparatus as set forth in claim 13, wherein the passive low-pass filter comprises a spiral shaped electrode formed on a substrate.

19. The high efficiency power amplifying apparatus as set forth in claim 18, wherein the spiral shaped electrode is a copper foil pattern forming a coil.

20. The high efficiency power amplifying apparatus as set forth in claim 13, wherein the phase compensation circuit is a passive filter having a same number of poles as said passive low-pass filter.

21. The high efficiency power amplifying apparatus as set forth in claim 13, wherein the phase compensation circuit is an active filter having a same number of poles as said passive low-pass filter.

22. The high efficiency power amplifying apparatus as set forth in claim 13, wherein the phase compensation circuit is within the linear voltage amplifier.

23. The high efficiency power amplifying apparatus as set forth in claim 22, wherein the linear voltage amplifier comprises:

an operational amplifier for voltage amplifying a signal applied to the signal input terminal;

an input circuit for adjusting an input impedance to the operational amplifier; and a feedback circuit to the operational amplifier;

said input circuit and feedback circuit each having a capacitor and a specific circuit constant such that a specific phase compensation is applied to a signal from the signal input terminal.

24. The high efficiency power amplifying apparatus as set forth in claim 23, wherein the input circuit and feedback circuit are comprised to effect a same number of poles as said passive low-pass filter.

25. The high efficiency power amplifying apparatus as set forth in claim 1, wherein each of said phase compensation circuit and said passive low-pass filter have a similar phase characteristic to one another.

26. The high efficiency power amplifying apparatus as set forth in claim 13, wherein each of said phase compensation circuit and said passive low-pass filter have a similar phase characteristic to one another.

* * * * *